United States Patent [19]

Kondo et al.

[11] Patent Number: 5,458,085
[45] Date of Patent: Oct. 17, 1995

[54] MAGNESIUM-DOPING IN III-V COMPOUND SEMICONDUCTOR

[75] Inventors: Makoto Kondo; Chikashi Anayama, both of Kawasaki, Japan

[73] Assignee: Fujitsu Limited, Kawasaki, Japan

[21] Appl. No.: 325,072

[22] Filed: Oct. 19, 1994

Related U.S. Application Data

[62] Division of Ser. No. 26,065, Mar. 4, 1993, Pat. No. 5,381,756.

[30] Foreign Application Priority Data

Mar. 4, 1992 [JP] Japan .................. 4-047326

[51] Int. Cl.⁶ .......................... H01L 21/223
[52] U.S. Cl. ............... 117/104; 117/200; 437/5; 437/126
[58] Field of Search ................. 117/104, 108, 117/925, 937; 437/5, 107, 126, 133

[56] References Cited

U.S. PATENT DOCUMENTS

| | | | |
|---|---|---|---|
| 4,636,298 | 1/1987 | Buss et al. | 208/65 |
| 4,975,299 | 12/1990 | Mir et al. | 427/52 |
| 5,104,824 | 4/1992 | Clausen et al. | 437/90 |
| 5,238,857 | 8/1993 | Kwon et al. | 437/110 |

OTHER PUBLICATIONS

Nishikawa et al, "Anomalous Mg Incorporation Behavior in InGaAlP Grown by metalorganic Chemical Vapor Deposition," Extended Abstracts of the 22nd Conference on Solid State Devices and Materials, Sendai, 1990, pp. 509–512.

Hatano et al., "Magnesium Doping Using an Adduct of Trimethylaluminum and Dimethylmagnesium in Metalorganic Chemical Vapor Deposition," Journal of Crystal Growth, vol. 115, North–Holland, 1991, pp. 455–459.

Hatano et al., "New Magnesium Doping Source for Metalorganic Chemical Vapor Deposition: Octamethyldialuminummonomagnesium," Appl. Phys. Lett., vol. 58, No. 14, Apr. 18, 1991, pp. 1488–1490.

Kondo et al., "Mg-Doping Transients During Metalorganic Vapor Phase Epitaxy of GaAs and AlGaInP," Journal of Crystal Growth, Apr. 1994.

Primary Examiner—R. Bruce Breneman
Assistant Examiner—Felisa Garrett
Attorney, Agent, or Firm—Staas & Halsey

[57] ABSTRACT

A method of manufacturing a semiconductor device having a step of growing a plurality of electrically connected p-type group III–V compound semiconductor layers by organometallic vapor phase epitaxy. In growing the plurality of p-type group III–V compound semiconductor layers, all or some of the p-type layers are grown by using a Mg organometallic compound as a p-type impurity and adding an Al organo-metallic compound of a predetermined amount. Doping both the Mg organo-metallic compound and Al organo-metallic compound at the same time considerably shortens the Mg doping delay.

8 Claims, 11 Drawing Sheets

MAGNESIUM-DOPING IN III-V COMPOUND SEMICONDUCTOR

This application is a division, of application No. 08/026,065, filed Mar. 30, 1993, now U.S. Pat. No. 5,381,756.

BACKGROUND OF THE INVENTION a) Field of the Invention

The present invention relates to a method of manufacturing semiconductor devices, and more particularly to a semiconductor manufacturing method having a step of growing group III–V compound semiconductor layers by organometallic vapor phase epitaxy (MOVPE).

Demand for visible light semiconductor lasers is increasing for the application to light sources of optical disk read/write, point of sales (POS) systems, printers, and the like. AlGaInP based semiconductor lasers using GaAs substrates are widely used as such visible light semiconductor lasers.

b) Description of the Related Art

An AlGaInP based visible light semiconductor laser is formed on a GaAs substrate and has a GaInP or AlGaInP active layer sandwiched between AlGaInP clad layers.

FIG. 5A shows an example of the structure of an AlGaInP/(Al)GaInP visible light semiconductor laser according to the conventional technique. On an $n^+$-type GaAs substrate 61, an n-type GaAs buffer layer 62 is grown, and then an n-type AlGaInP clad layer 63 is grown, to form n-type regions. A group IV element Si, group VI elements Se, S, and the like, may be used as n-type impurities.

On these n-type regions, a non-doped GaInP or AlGaInP active layer 64 is formed on which a p-type AlGaInP clad layer 65 and p-type GaInP intermediate layer 67a are formed in this order. Thereafter, a $SiO_2$ striped mask is formed on the surface of the device. Mesa etching is performed using the $SiO_2$ mask as the etching mask to remove the p-type clad layer 65 down to the intermediate depth.

This mesa etching $SiO_2$ mask is also used as a growth mask to grow an n-type GaAs current block layer 66 to embed with it both the side surfaces of the mesa structure. The GaAs current block layer 66 confines lateral light and hole current of the active layer 64. The surface is then covered with a p-type GaAs contact layer 68a to obtain a finished semiconductor laser structure.

Also formed are an n-side electrode 69 under the n-type GaAs substrate 61, and a p-side electrode 70 above the p-type GaAs contact layer 68a.

In the semiconductor laser having the structure as shown in FIG. 5A, it is desired to suppress heat generation in the p-type clad layer 65 by reducing the resistivity thereof as much as possible, and to provide effective confinement of injected carriers. For this reason, it is desirable to increase the doping concentration of the p-type clad layer 65 and p-type intermediate layer 67a as much as possible.

FIG. 5B shows another structure of an AlGaInP/GaInP visible light semiconductor laser. A striped mesa structure is formed on the surface of a Zn doped p-type GaAs substrate 111. A Se doped n-type GaAs current block layer 112 is formed covering both the side surfaces of the mesa structure. A gradually declining weakened mesa structure is then formed on the surface of this device. The current block layer 112 forms a potential barrier against holes transported from the p-type substrate 111, to concentrate hole current above the hill top of the mesa structure.

Formed on such a composite mesa structure are a Zn doped p-type GaAs buffer layer 118 and Zn doped AlGaInP clad layer 115. An intermediate layer 114 has an intermediate band gap between those of the buffer layer 118 and clad layer 115.

On these p-type regions, a non-doped GaInP active layer 116 is formed on which n-type layers are deposited and laminated. First, a Se doped n-type AlGaInP clad layer 117 is formed on which a Se-doped GaInP intermediate layer 118 and Se doped n-type GaAs contact layer 119 are formed. The intermediate layer 118 has an intermediate band gap between those of the clad layer 117 and contact layer 119.

This laminated-layer structure is epitaxially grown on the mesa structure and has a curved surface similar to the mesa structure. With such a structure, a light waveguide is formed above the hill top of the mesa structure. Since the light waveguide is self-aligned bent with the mesa structure, this laser is called a self-aligned waveguide laser.

The intermediate layer 114 having the intermediate band gap between those of the buffer layer 118 and clad layer 115 generates potential barriers, each called a spike, at the both sides thereof, because of the heterojunction. In order to prevent the suppression of current to be caused by this potential barrier, it is desirable to uniformly dope p-type impurities at a high concentration into the buffer layer 113, intermediate layer 114, and clad layer 115, or to use the graded structure providing a gradual change of the band structure. This approach is also applicable to the structure shown in FIG. 5A.

Nishikawa et al say that the doping delay, although it depends greatly upon the growth temperature, and upon whether the matrix is InAlP or InGaP, it can be explained by a model simulating an inability of doping until Mg is accumulated to a certain amount on a solid phase surface (refer to Extended Abstracts of the 22nd, 1990 International Conference on Solid State Devices and Materials, Sendai, 1990, pp.509 to 512).

Hatano et al propose to use adduct of trimethyl aluminum and dimethyl magnesium in order to realize Mg doping without a doping delay.

AlGaInP based materials are generally grown using organo-metallic vapor phase epitaxy. As p-type dopants, Zn is generally doped by the use of a source material of dimetyl zinc (DMZn, $(CH_3)_2Zn$) or diethyl zinc (DEZn, $(C_2H_5)_2Zn$).

However, the vapor pressure of Zn is high and the release or removable of Zn from the crystal surface is conspicuous, resulting in a hardship of high concentration doping ($5*10^{17}$ $cm^{-3}$ or higher). Diffusion of Zn is large in an AlGaInP based crystal. When doped in an AlGaInP based crystal, Zn generates by-products by the reactions with In or P, which may become nuclei of crystal defects.

Several problems discussed above are associated with Zn when used as p-type dopants. From this reason, Mg in place of Zn has been expected as alternative dopants.

Mg allows high concentration doping (in the order of $2*10^{18}$ $cm^{-3}$). Mg diffuses less in an AlGaInP based crystal. Mg will not generate by-products upon reacting with AlGaInP based matrix materials.

Mg used as p-type dopants has many advantages discussed above. However, the problem of doping delay is associated with Mg used as p-type dopants for AlGaInP based materials. Mg will not be doped to a desired amount at the initial stage of the crystal growth. In other words, there is a time delay between the start of supplying Mg and the actual doping of Mg into the crystal.

This doping delay phenomenon is relatively small in AlGaInP based material containing Al, but conspicuous in GaInP, GaAs, or the like not containing Al, posing a serious problem. It is known that the doping delay can be made small if the amount of Mg source material is increased. However, in the range of carrier concentrations practically used, the control of the amount of Mg is difficult, leaving the problem unsolved.

The doping delay phenomenon in Mg doping will be described with reference to FIG. 5C which shows the growth of a Mg doped GaAs epitaxial film on a Zn doped GaAs substrate, with the abscissa representing the depth from the surface and the ordinate representing the dopant concentration.

In the GaAs epitaxial film, the Mg concentration is extremely small at the initial stage of the growth and gradually rises as the growth progresses further, although the same amount of Mg is used during the Mg doping process.

At the initial stage, the GaAs epitaxial film becomes p-type because of the out-diffusion of Zn from the Zn doped GaAs substrate. However, the region from the low Zn concentration area to the gradually rising Mg concentration area becomes a high resistance area because of low impurity (Mg) concentration.

Particular problems when using Mg accompanied with the doping delay as p-type dopant will be described with reference to FIG. 5D.

In FIG. 5D, on a p-type GaAs substrate 71, a p-type GaAs buffer layer 72 is grown on which a p-type GaInP intermediate layer 73 and p-type AlGaInP clad layer 74 are grown to form p-type regions. On these p-type regions, a non-doped GaInP layer 75 is grown as an active layer on which an n-type AlGaInP clad layer 76 and an n-type GaAs contact layer 77 are grown to form n-type regions.

Suppose that Mg is doped as p-type dopant into the GaAs buffer layer 72, GaInP intermediate layer 73, and AlGaInP clad layer 74. In the GaAs buffer layer 72 and GaInP intermediate layer 73, a desired p-type may not be obtained because of the difficulty in doping Mg. In some cases, these regions become n-type. Without a desired amount of doped Mg, the finished diode structure will not allow current to easily pass or degrade its I–V characteristics.

SUMMARY OF THE INVENTION

It is an object of the present invention to provide a method of manufacturing a semiconductor device, using Mg as p-type dopants while shortening a doping delay.

According to one aspect of the present invention, there is provided a method of manufacturing a semiconductor device having a step of growing a group III–V compound semiconductor layer by organo-metallic vapor phase epitaxy, comprising the step of: using as a p-type impurity a mixture gas of a Mg organo-metallic compound and an Al organo-metallic compound, in growing a p-type group III–V compound semiconductor layer by organo-metallic vapor phase epitaxy, to form a p-type layer doped with Mg and containing Al of the composition from about 0.01 to about 0.1 at an interfacing layer at the initial stage of crystal growth.

Mg can be effectively doped in a crystal starting from the initial stage of crystal growth, by mixing an Al organo-metallic compound with a Mg source organo-metallic compound.

It is possible to solve the Mg doping delay problem of the semiconductor crystal growth of a group III–V compound not containing Al, such as GaInP and GaAs. Therefore, the p-type regions of a visible light semiconductor laser using AlGaInP based group III–V compound semiconductor can be formed by Mg doping.

DETAILED DESCRIPTION OF THE PREFERRED EMBODIMENTS

Figure 1A:
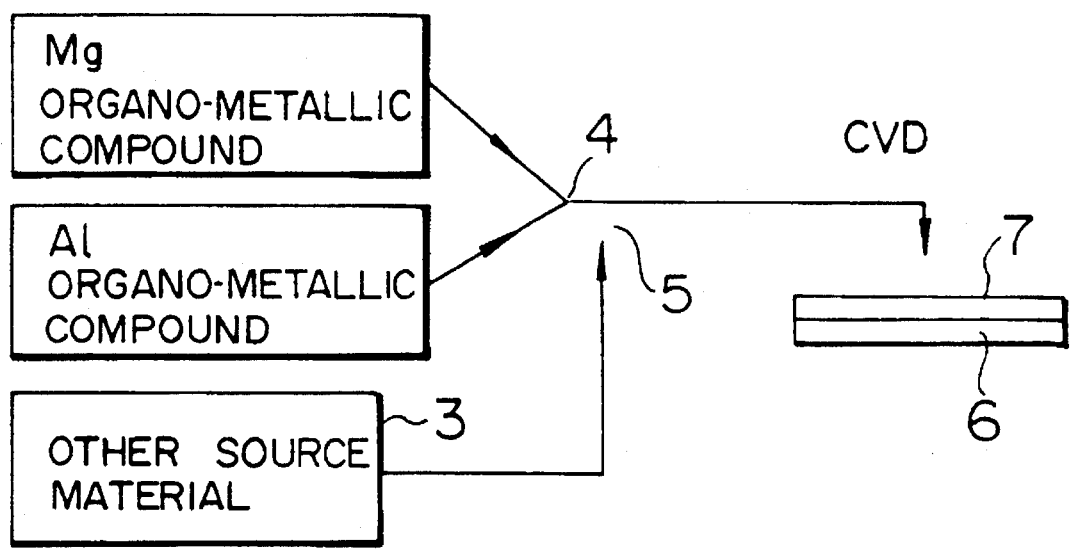
FIGS. 1A and 1B are schematic diagrams illustrating the fundamental concept of the present invention.
Figure 1B:
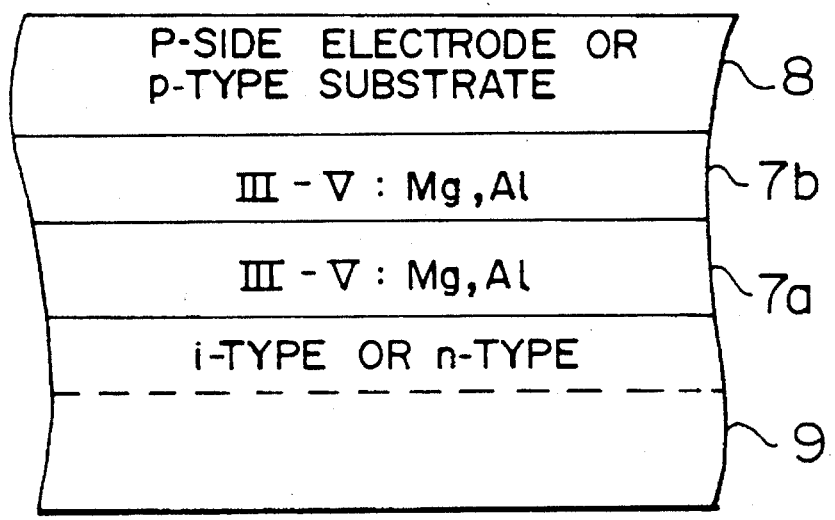

FIGS. 1A and 1B are diagrams explaining the fundamental concept of the present invention. FIG. 1A is a schematic diagram illustrating a semiconductor device manufacturing method, and FIG. 1B shows the structure of p-type group III–V compound semiconductor layers of a semiconductor device.

As shown in FIG. 1A, in growing a p-type group III–V compound semiconductor layer 7, a Mg organo-metallic compound 1 is used as p-type dopant, and at the same time, an Al organo-metal compound 2 which is otherwise an unnecessary composition of a grown layer is mixed with the Mg compound 1 at a mixture unit 4. In this case, the amount of Al is 0.1 or less in composition in order to eliminate the substantial influence of Al to the energy gap and refractive index of the grown layer. The mixed gas is added to another source material 3 at a mixture unit 5. The obtained source gas is used for the CVD growth of a p-type group III–V compound semiconductor layer 7 on an underlie crystal 6.

FIG. 1B shows an example of the structure of a semiconductor device manufactured by the method illustrated FIG. 1A. On an underlie layer 9 having an i-type or n-type region at least on the surface thereof, there are formed III–V compound semiconductor layers 7a and 7b with both Mg and Al being doped on those of which a p-side electrode or p-type substrate 8 is formed. The group III–V compound semiconductor layers 7a and 7b interconnect the p-side electrode or p-type substrate 8 and the i-type or n-type underlie layer 9.

The crystal growth includes not only the growth from the lower to upper layers as viewed in FIG. 1B, but also the growth from the upper to lower layers.

The doping delay phenomenon is suppressed by using as dopants a mixture of an Al organo-metallic compound and a Mg organo-metallic compound. Therefore, a variety of problems to be caused by the doping delay phenomenon can be alleviated.

It has been said that the Mg doping delay is reasoned to the attachment of a Mg organo-metallic compound the surface of quartz piping tubes, quartz reactor tube, or the like.

Although the reason why the doping delay phenomenon is suppressed by adding Al to a Mg compound is not clear, it is conceivable that the mixture of an Al organo-metallic compound and a Mg organo-metallic compound changes the property of the Mg organo-metallic compound and the degree of attachment of Mg to the piping tubes, reactor tube, or the like.

Al entered in the grown layer changes the composition of the grown layer. However, the necessary amount of Al is not so large that the property of a semiconductor device changes only at a negligible degree.

Figure 2:
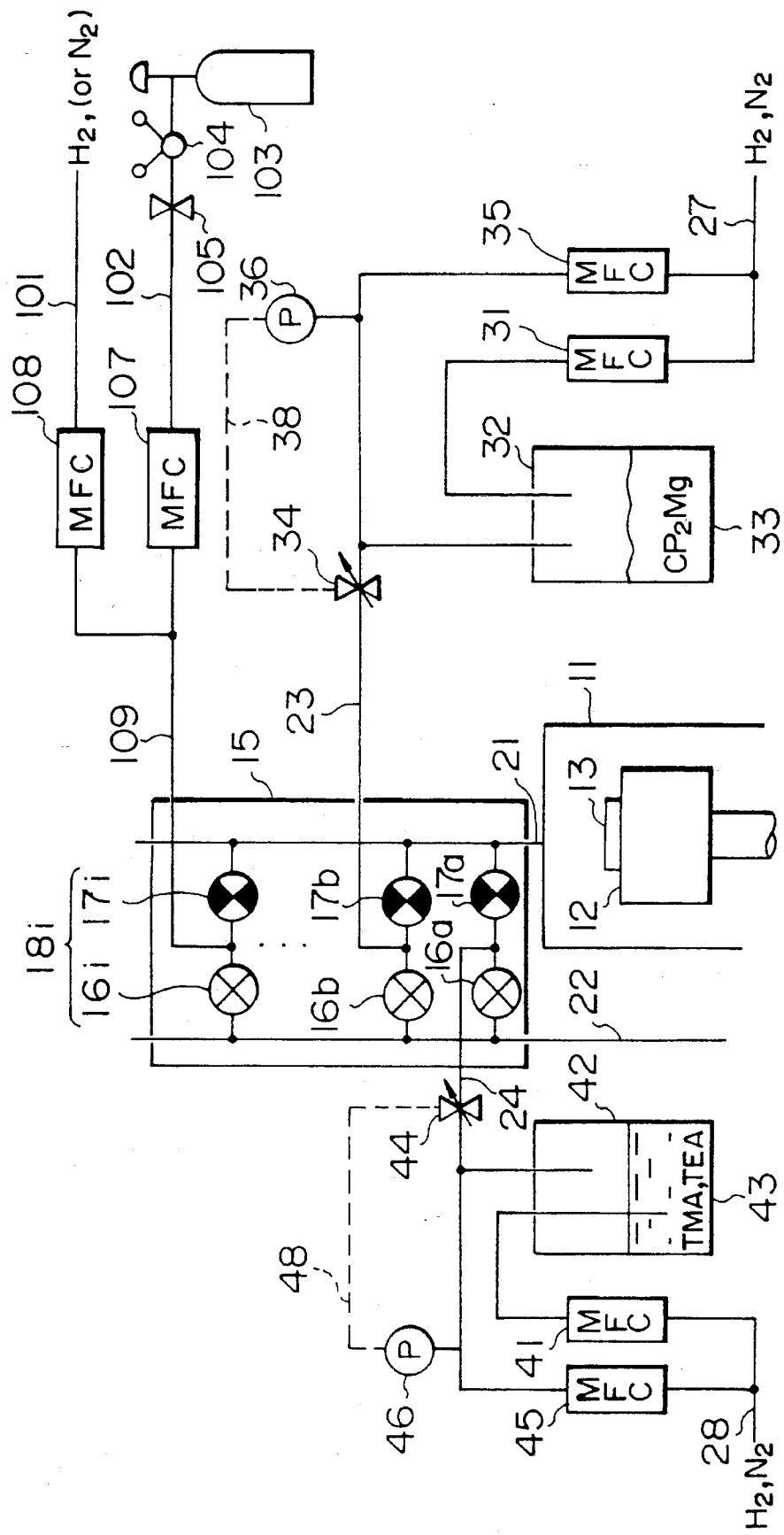
FIG. 2 is a block diagram showing a CVD crystal growth system for practicing a semiconductor device manufacturing method according to an embodiment of the present invention.

FIG. 2 schematically shows a CVD crystal growth system for practicing the semiconductor device manufacturing method according to an embodiment of the present invention.

A susceptor 12 is mounted within a quartz reactor tube 11, and an underlie substrate 18 is placed on the susceptor 12 for the crystal growth. A crystal growth source material gas is introduced into the reactor tube 11 from a source gas supply piping 21 via a gas switching manifold 15. The manifold 15 has a supply piping 21 and vent piping 22 to which source material gas pipings 23 and 24 are connected via interlocking valves 18 including valves 16 and 17.

For example, when one of valves 16a and 17a of the interlocking valve 18a opens, the other closes. In the state shown in FIG. 2, valves 17a, 17b, . . . , 17i are close.

A carrier gas such as $H_2$ and $N_2$ from the carrier piping 27 is supplied via a mass flow controller 81 to the vessel 32 containing cyclopentadienylmagnesium ($Cp_2Mg$) 33, and the carrier gas contained the $Cp_2Mg$ gas is guided to a pressure control valve 34. The Al source material may be amine based materials such as trimethylaminealane $(CH_3)_3NAlH_3$ and dimethylaminealane $(CH_3)_3C_2H_5NAlH_3$. Similarly, amine based source for Mg can also be used.

The carrier gas from the carrier gas piping 27 is also guided via a mass flow controller 85 directly to the pressure control valve 84. A pressure gage 86 is connected to the midst of the piping from the mass flow controller 85 to the pressure control valve 84, to feed the measured pressure via a control line 88 back to the pressure control valve 36 to maintain the pressure constant. The dopant gas is introduced via the pressure control valve 84 and piping 28 to the gas switching manifold 15, either to be supplied via the valve 17b to the reactor tube 11 or to be drained via the valve 16b.

As the cyclopentadienylmagnesium, it is preferable to use biscyclopentadienylmagnesium $(C_5H_5)_2Mg$ or bismethylcyclopentadienylmagnesium $(CH_3C_5H_4)_2Mg$.

The carrier gas is introduced from the carrier gas piping 28 via a mass flow controller 41 to a vessel 42 containing trimethylaluminum $(CH_3)_3Al$ (TMA) or triethylaluminum $(C_2H_5)_3Al$ (TEA), and after bubbling, guided via a pressure control valve 44 to a piping 24.

The carrier gas 28 from the carrier gas piping 28 is also guided via a mass flow controller 45 directly to the pressure control valve 44. A pressure gage 46 is connected to the midst of the piping from the mass flow controller 45 to the pressure control valve 44, to feed the measured pressure via a control line 48 back to the pressure control valve 44.

The pressure at the upstream of the control valve 44 is therefore maintained constant. A piping 24 connected to the pressure control valve 44 is either connected via the valve 17a to the reactor tube 11 or connected via the valve 16a to the drainage side.

The carrier gas $H_2$ or $N_2$ is introduced to a piping 101 and via a mass flow controller 108 to a piping 109. An arsine $(AsH_3)$ gas in a bomb diluted at 10 to 20% with $H_2$ is introduced via pressure reducing valves 104 and 105 to a piping 102 and via a mass flow controller 109 to the piping 109. With the similar arrangement, a phosphine $(PH_3)$ gas diluted with $H_2$ is also supplied.

In the whole reactor system, introduced to the gas switching manifold 15 are trimethylindium (TMIn) as the In source, TMGa or TEGa as the Ga source, $AsH_3$ as the As source, and $PH_3$ as the P source. The carrier gas $H_2$ is used during the crystal growth, and $N_2$ gas is used for the purge before and after the crystal growth.

In a general MOVPE, the reactor tube 11 is maintained in a reduced pressure atmosphere in the order of 10 torr, and the upstream of the pressure control valve (34 or 44) is maintained at about an atmospheric pressure. $Cp_2Mg$ used as dopants and TMA or TEA used as an additive are highly purified to the semiconductor grade in order not to deteriorate the characteristics of a grown layer. The source gas of a III–V group compound semiconductor to be grown is guided from another supply line to the piping 21 via the gas switching manifold 15. When a Mg doped p-type III–V compound semiconductor layer is to be grown, a predetermined amount of Al source gas is supplied together with a Mg source gas.

Figure 3:
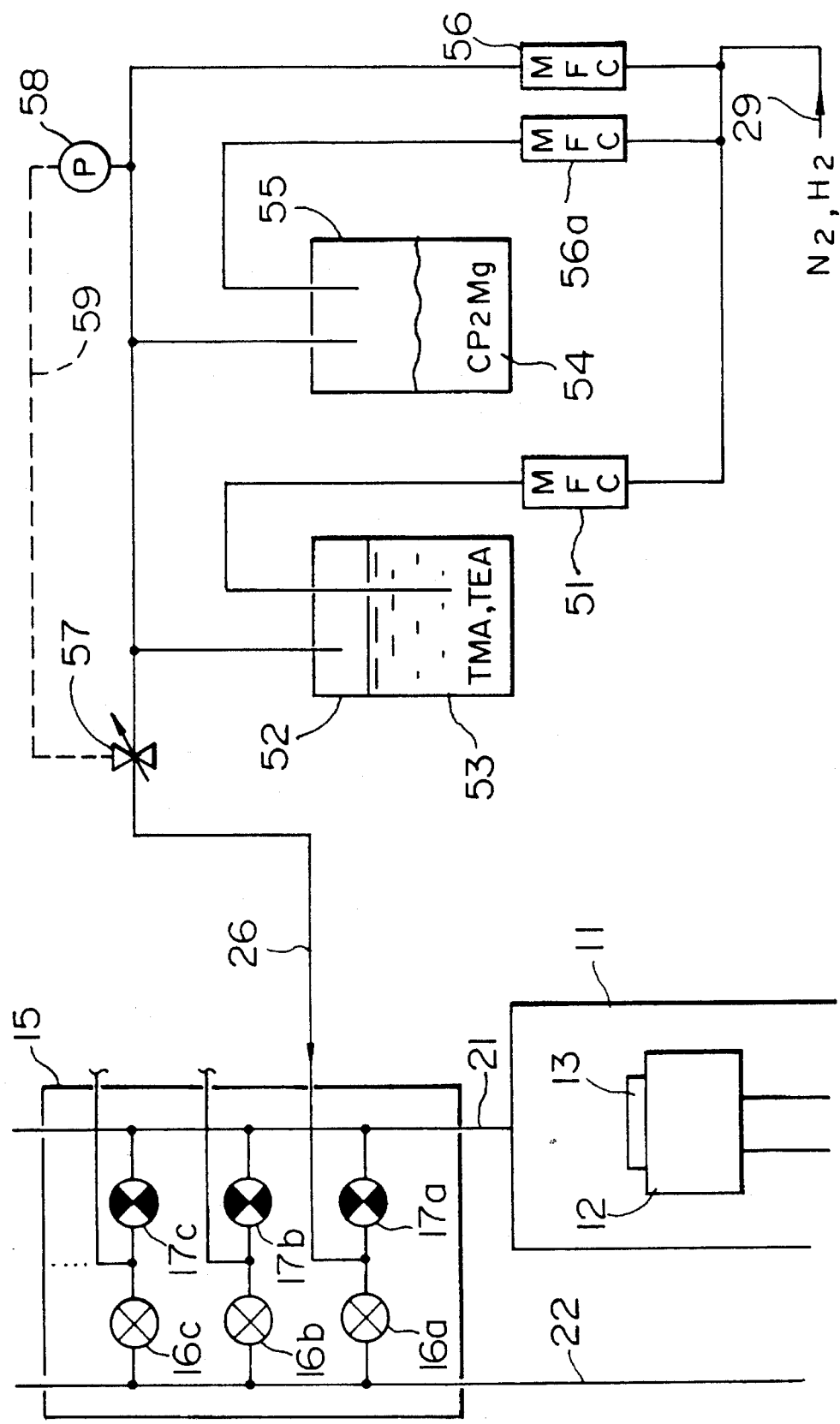
FIG. 3 is a block diagram showing another CVD crystal growth system for practicing the semiconductor device manufacturing method according to an embodiment of the present invention.

FIG. 3 schematically shows another CVD crystal growth system for practicing the semiconductor device manufacturing method according to an embodiment of the present invention. A reactor tube 11, susceptor 12, underlie substrate 13, gas switching manifold 15, supply piping 21, and vent piping 22 are similar to those shown in FIG. 2.

In this system, an Mg organo-metallic compound as p-type dopants mixed with an Al organo-metallic compound is guided from a piping 26 to valves 16a and 16b of the gas switching manifold 15.

A carrier gas such as $H_2$ and $N_2$ from a carrier gas piping 29 is supplied via a mass flow controller 51 to a vessel 52 containing an Al organo-metallic compound 53 such as TMA and TEA, and guided after bubbling to a pressure control valve 57. The carrier gas is also guided to a vessel 55 containing a Mg organo-metallic compound 54 such as $Cp_2Mg$ via a mass flow controller 56a, and the carrier gas mixed with vapor of $Cp_2Mg$ is guided to a pressure control valve 57.

The carrier gas is guided via a mass flow controller 56 directly to the pressure control valve 57. A pressure gage 58 is connected to the midst of the piping from the mass flow controller 56 to the pressure control valve 57, to feed back a control signal representing the measured pressure via a control line 59 to the pressure control valve 57 to control it.

With this system constructed as above, the Mg organo-metallic compound and Al organo-metallic compound are mixed together under a relatively high pressure at the upstream of the pressure control valve 57, and guided from the pressure control valve 57 to the lower pressure side piping 26. Since the Mg organo-metallic compound and Al organo-metallic compound are mixed together under the relatively high pressure, a more homogeneous mixture gas can be supplied.

was investigated whether trimethylaluminum and biscyclopentadienylmagnesium ($Cp_2Mg$) react together under the room temperature and atmospheric pressure and produce other compounds. $Cp_2Mg$ and TMA were introduced into a flask and mixed together, and then heated to 50° C. and agitated for three hours. After reducing the pressure in the reactor tube to 0.5 torr, non-reacted TMA was removed and the remaining particles were sublimated at 50° to 90° C./0.5 torr. The elements of the sublimated gases of first several grams and last several grams were analyzed. The analysis results showed that both the samples remained $Cp_2Mg$. It can be assumed therefore that there is no reaction in the reactor between the trimethylaluminum and biscyclopentadienylmagnesium.

Figure 4:
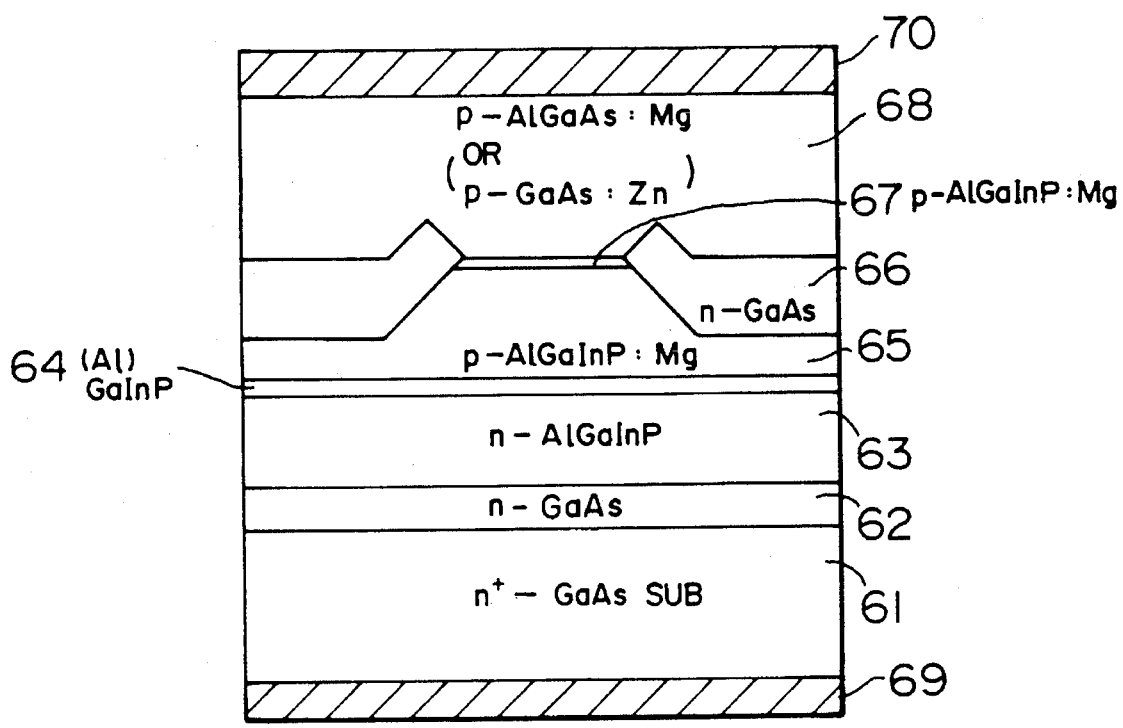
FIG. 4 is a cross sectional view showing an example of the structure of a visible light semiconductor laser.

FIG. 4 shows an example of the structure of a semiconductor device manufactured using the CVD crystal growth system shown in FIG. 2 or 3.

In the visible light semiconductor laser shown in FIG. 4, on an $n^+$-type GaAs substrate 61, an n-type GaAs buffer layer 62 and n-type AlGaInP clad layer 63 are grown on which a non-doped GaInP or AlGaInP active layer 64 is formed.

On the active layer 64, a Mg doped p-type AlGaInP clad layer 65 and Mg doped p-type AlGaInP intermediate layer 67 are formed and etched in the form of a mesa structure. Both the sides of the mesa structure are filled in with an n-type GaAs region 66.

On these layers, a Mg doped p-type AlGaAs contact layer 68 or Zn doped p-type GaAs contact layer is formed. An n-side electrode is formed on the bottom surface of the $n^-$-type GaAs substrate 61, and a p-side electrode 70 is formed on the top surface of the p-type GaAs contact layer 68. The composition of the clad layers 68 and 65 is $(Al_{0.7}Ga_{0.3})_{0.5}In_{0.5}P$.

In manufacturing the visible light semiconductor laser having the structure shown in FIG. 4, the layers up to the active layer 64 are formed on the $n^+$-type GaAs substrate by the ordinary MOVPE, the crystal growth for the p-type layers on which are carried out while doping a Mg organo-metallic compound as the p-type dopands mixed with an Al organo-metallic compound.

Figure 5A:
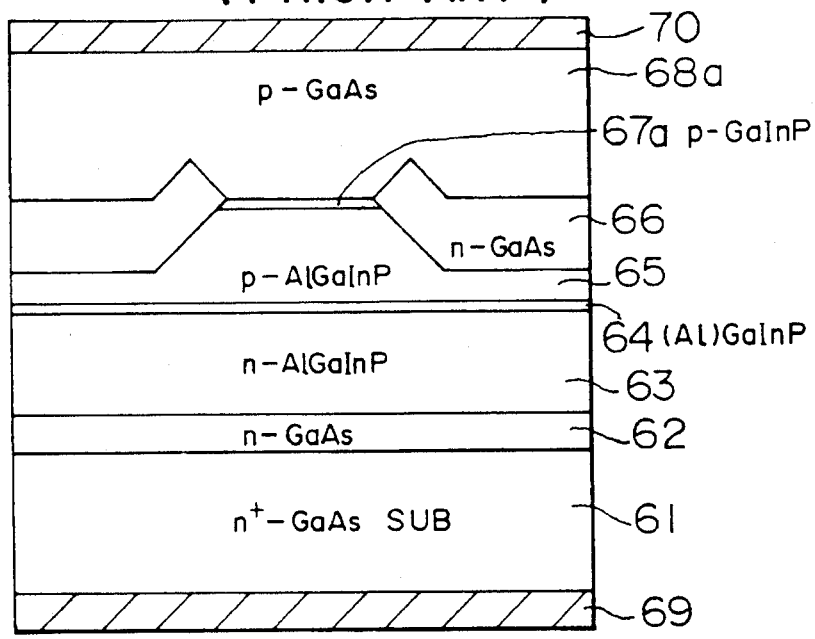
FIGS. 5A and 5B are schematic cross sectional views of visible light semiconductor lasers according to the conventional techniques.

In contrast with the conventional visible light semiconductor laser shown in FIG. 5A, Al which is not required to be added otherwise, is added to the intermediate layer 67. GaAs used for the contact layer may be Zn doped GaAs because Zn can be doped generally at a high concentration, or may be Mg doped AlGaAs.

In forming not only the structure shown in FIG. 4 but also another structure having a plurality of AlGaInP based group III–V semiconductor layers, a Mg organo-metallic compound and Al organo-metallic compound are mixed and used as the p-type dopants to reduce the Mg doping delay.

The crystal growth while supplying both the Mg organo-metallic compound and Al organo-metallic compound will be described more in detail.

Figure 6A:
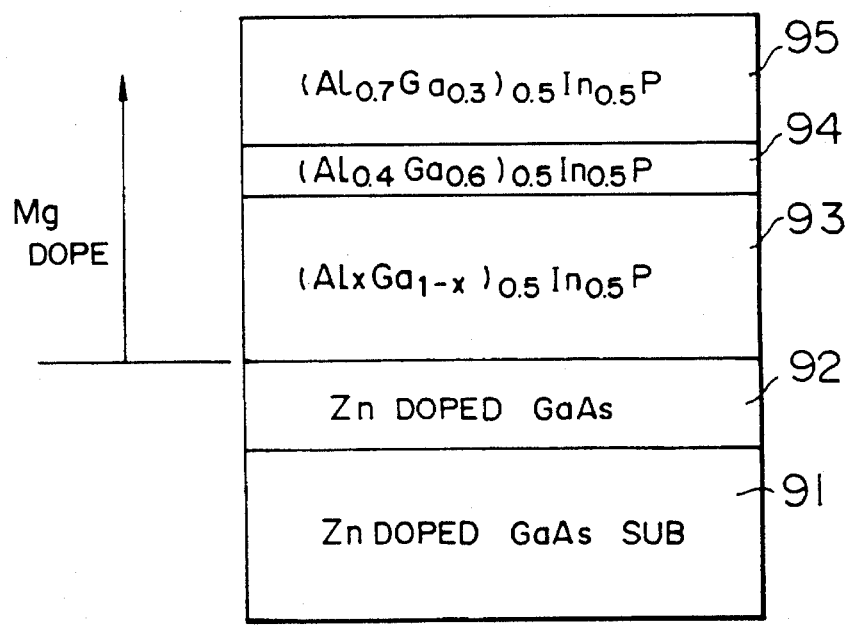
FIGS. 6A and 6B are diagrams explaining the Mg doping experiments made by the present inventors, FIG. 6A being a schematic cross sectional view showing the structure of a sample laser, and FIG. 6B being a graph showing the results of Mg doping without adding Al.

FIG. 6A shows the structure of a sample device used for verifying the effects of Mg doping. A Zn doped GaAs buffer layer 92 is grown on a Zn doped GaAs substrate 91 to form an underlie substrate for the growth of Mg doped crystal.

On the underlie substrate, an $(Al_xGa_{1-x})_{0.5}In_{0.5}P$ first intermediate layer 93 (x=0 to 0.4), $(Al_{0.4}Ga_{0.6})_{0.5}In_{0.5}P$ second intermediate layer 94, and $(Al_{0.7}Ga_{0.3})_{0.5}In_{0.5}P$ clad layer 95 are sequentially formed while doping Mg. The compositions of the first and second intermediate layers 93 and 94 are selected so as to gradually connect the buffer and clad layers 92 and 95. The substrate temperature during the crystal growth is selected in the range from 650° C. to 800° C. For example, GaAs is set to 670° C., and AlGaInP is set to 670° to 730° C. depending on the composition of Al.

Figure 6B:
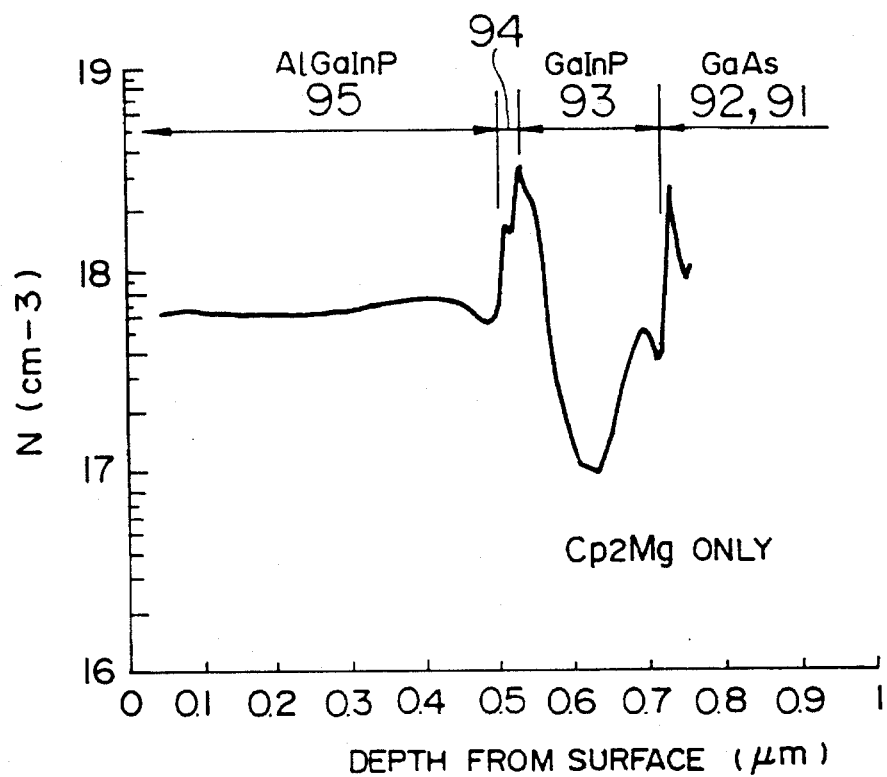

FIG. 6B shows the results obtained when doping only $Cp_2Mg$ as the Mg dopant source gas without adding Al (i.e., substituting x=0 for the compositions of the intermediate layer 93 $(Al_xGa_{1-x})_{0.5}In_{0.5}P$). The abscissa represents the depth from the surface, and the ordinate represents the hole concentration.

On the GaAs regions 91 and 92, there were formed an AlGaP layer 93 of 0.2 μm, an $(Al_{0.4}Ga_{0.6})_{0.5}In_{0.5}P$ layer 94 of about 300 angstroms, and $(Al_{0.7}Ga_{0.3})_{0.5}In_{0.5}P$ layer 95 in this order.

As seen from the carrier distribution shown in FIG. 6B, the hole concentration lowers rapidly as the Zn doped GaAs regions transit to the GaInP layer 93. Thereafter, the hole concentration takes a high value near the $(Al_xGa_{1-x})_{0.5}In_{0.5}P(x=0.4)$ layer 94, and gradually converges to a constant value. The hole concentration lowered by one digit means a resistivity raised by one digit.

The insufficient hole concentration of the growth layer, although it was intended to be a high concentration p-type region, deteriorates the I–V characteristics of a finished semiconductor device.

Figure 7A:
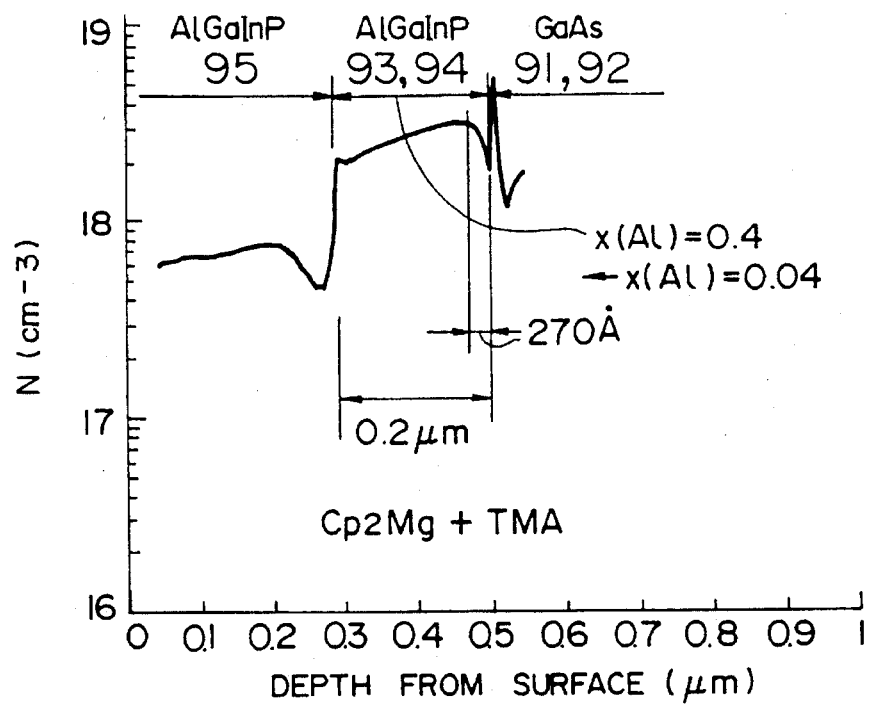
FIGS. 7A and 7B are graphs showing the results of p-type doping with $Cp_2Mg$ added with TMA, by using samples shown in FIG. 6A.
Figure 7B:
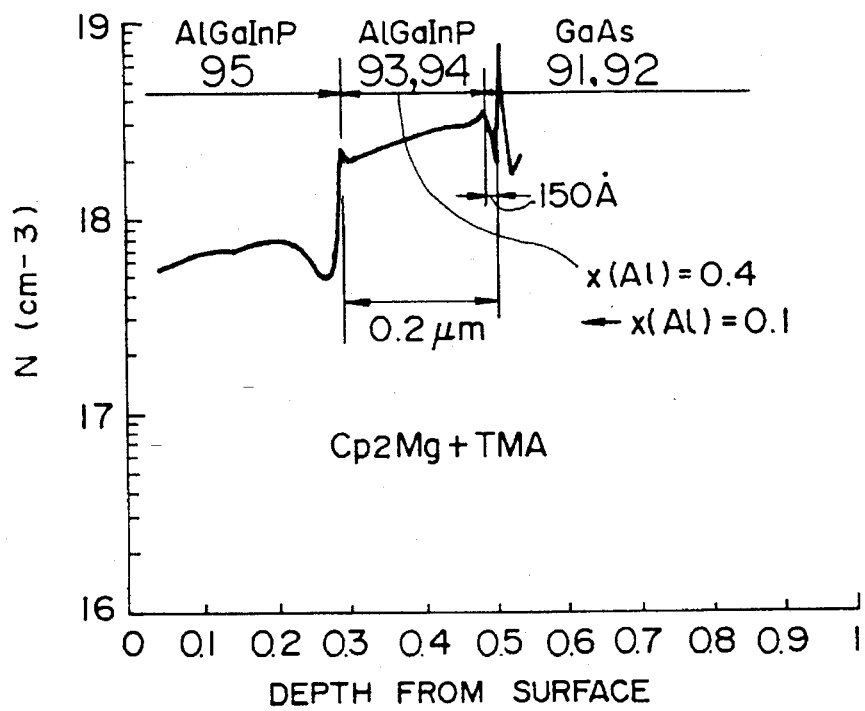

FIGS. 7A and 7B show the results obtained when using both Mg source $Cp_2Mg$ and trimethylaluminum TMA.

In FIG. 6B, Mg cannot be doped immediately after growing a GaInP layer on the GaAs layer. Therefore, Al is mixed at the start of forming the GaInP layer in FIG. 7A preventing generation of band discontinuity. On Zn doped GaAs regions 91 and 92, $(Al_xGa_{1-x})_{0.5}In_{0.5}P$ layers 93 was formed gradually increasing the composition x from 0.04 to 0.4 while doping Mg and Al. On these layers, an $(Al_{0.4}Ga_{0.6})_{0.5}In_{0.5}P$ layer 94 and an $(Al_{0.7}Ga_{0.3})_{0.5}P$ layer 95 were formed. The thickness of each layer was the same as FIG. 6B.

In this sample, the hole concentration lowers once slightly as the Zn doped GaAs regions 91 and 92 transit to the AlGaInP layers 93 and 94, and immediately thereafter recovers and takes generally a uniform and high value. The width of the region where the hole concentration lowers in the Mg doped region was about 270 angstroms. Even in this region, the hole concentration is about $1*10^{18} cm^{-3}$ or higher, providing a sufficiently high concentration as compared with FIG. 6B.

FIG. 7B shows the results obtained by increasing the amount of Al mixed at the start of crystal growth, more than that shown in FIG. 7A. The composition gradient of $(Al_xGa_{1-x})_{0.5}In_{0.5}P$ layers 93 and 94 was gradually changed from x=0.1 to x=0.4. In this example, the pattern of the hole concentration distribution is generally the same as FIG. 7A. However, the drop of the hole concentration at the start region of Mg doping is shallower and narrower than FIG. 7A. The width of the hole concentration drop was about 150 angstroms.

The results shown in FIG. 7A is satisfactory for the p-type layer growth, and the results shown in FIG. 7B is much more satisfactory. From these results, it has been found it is preferable to use Mg organo-metallic compound with a predetermined amount or more or Al organo-metallic compound being added. For $(Al_xGa_{1-x})_{0.5}In_{0.5}P$, the amount of Al to be added is at least x=0.04 ($Al_{0.02}$ composition in the total III group elements), and preferably x=0.1 ($Al_{0.05}$ composition in the total group III elements) or more. It is however preferable to set the amount of Al component to $Al_{0.1}$ or less in the total group III elements so as not to substantially change the physical characteristics of a semiconductor layer.

Figure 8:
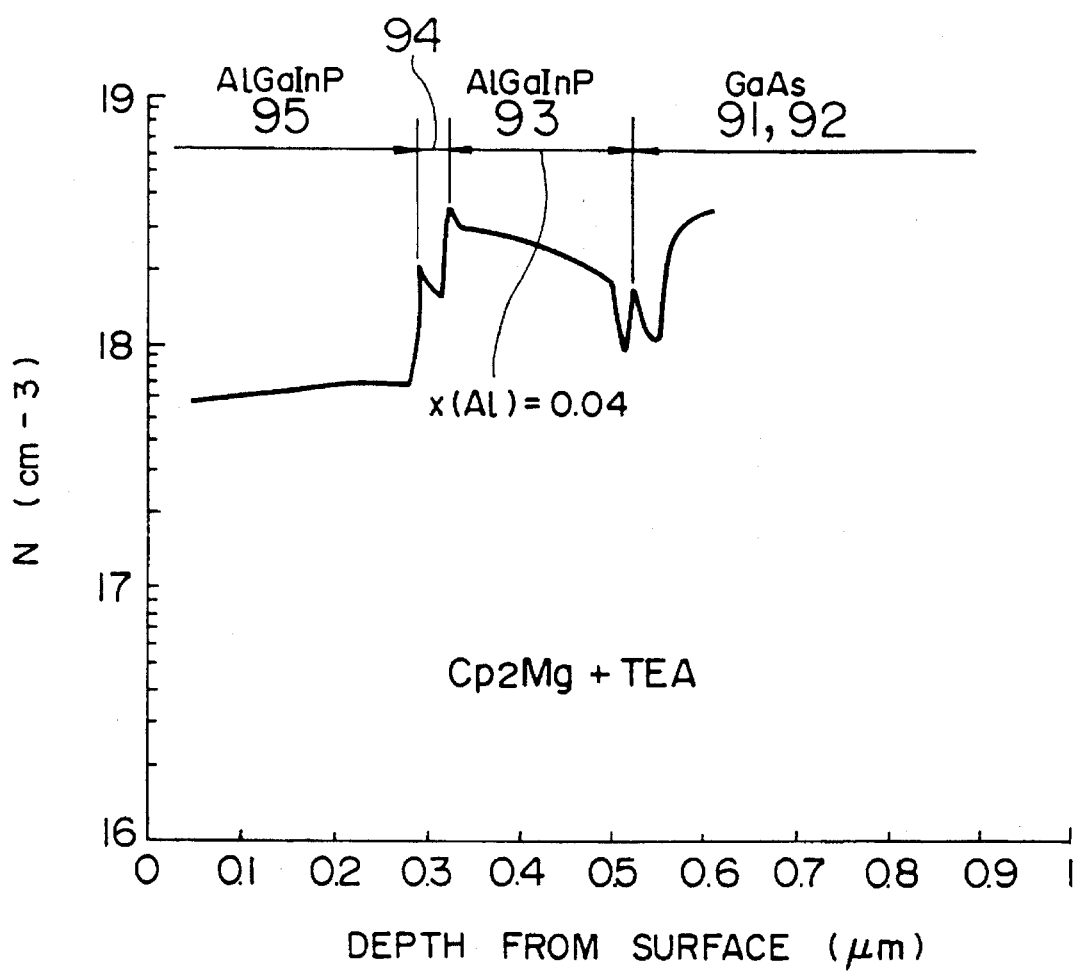
FIG. 8 is a graph showing the results of p-type doping with $Cp_2Mg$ added with TEA, by using a sample shown in FIG. 6A.

FIG. 8 shows the results obtained when using triethylaluminum TEA as Al organo-metallic compound to be added to Mg organo-metallic compound. In this crystal growth, x=0.04 was used as an $(Al_xGa_{1-x})_{0.5}In_{0.5}P$ layer 93.

Similar to the results shown in FIG. 7A, although the pattern of the hole concentration distribution provides a small drop at the start area of the AlGaInP layer 98, the concentration takes a value over about $1*10^{18}cm^{-3}$. Immediately thereafter, the concentration rises and takes generally a uniform and high value. It was also confirmed that the amount of Al of TEA as the Al organo-metallic compound was in the same order as TMA.

As described above, use of $Cp_2Mg$ as p-type dopants together with Al organo-metallic compound (TMA or TEA) in an AlGaInP based group III–V compound semiconductor provides a high hole concentration of $1*10^{18}cm^{-1}$ or more in substantially the constant range of 1 to $3*10^{18}cm^{-3}$. The doping delay is considerably improved as compared with conventional doping of Mg only.

Although the crystal contains Al, the amount of Al is in the order of $10^{21}cm^{-3}$ poses no practical problem when compared to the concentration of about $2*10^{22}cm^{-3}$ of group III elements contained in the crystal.

The amount of Al organo-metallic compound to be added to p-type dopant Mg organo-metallic compound depends on a desired dopant concentration of Mg.

Figure 9A:
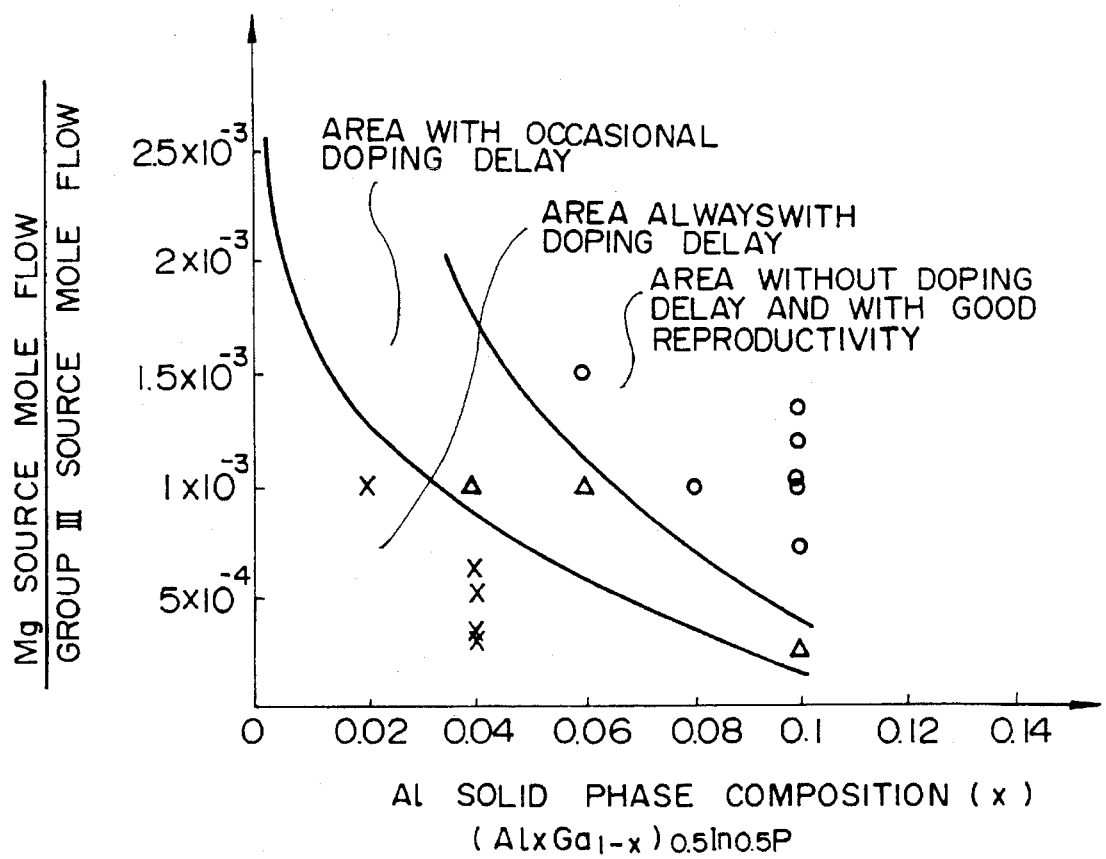
FIGS. 9A and 9B are graphs showing experimental data of doping delays relative to the amount of an Al organo-metallic compound added to a Mg organo-metallic compound.

FIG. 9A is a graph showing the doping delay as a parameter of the Al solid phase composition in a grown layer when the mole flow ratio of Mg source material is changed with the mole flow of group III material. In FIG. 9A, a circle symbol represents data without a doping delay and with a good reproductivity, a triangle symbol represents data with an occasional doping delay, and a cross symbol represents data always with a doping delay.

As apparent from FIG. 9A, the doping delay can be substantially eliminated if the Al solid phase composition x about 0.04 or more is used at the Mg source material mole ratio to the mole flow of the group III source material of about $2*10^{-3}$ or higher. The doping delay can be considerably shortened even at a very small solid state composition.

If the mole flow ratio of Mg source material relative to the III group source material mole flow is in the order of about $1*10^{-3}$, the doping delay can be shortened considerably by setting the Al solid state composition x to about 0.04 or more, and if it is set to about 0.06 to 0.07 or more, the doping delay can be substantially eliminated. The smaller the mole flow ratio of Mg source material, the larger the solid state composition of Al to be added. The composition x in the above description takes a value divided by 2 for the total group III elements.

Figure 9B:
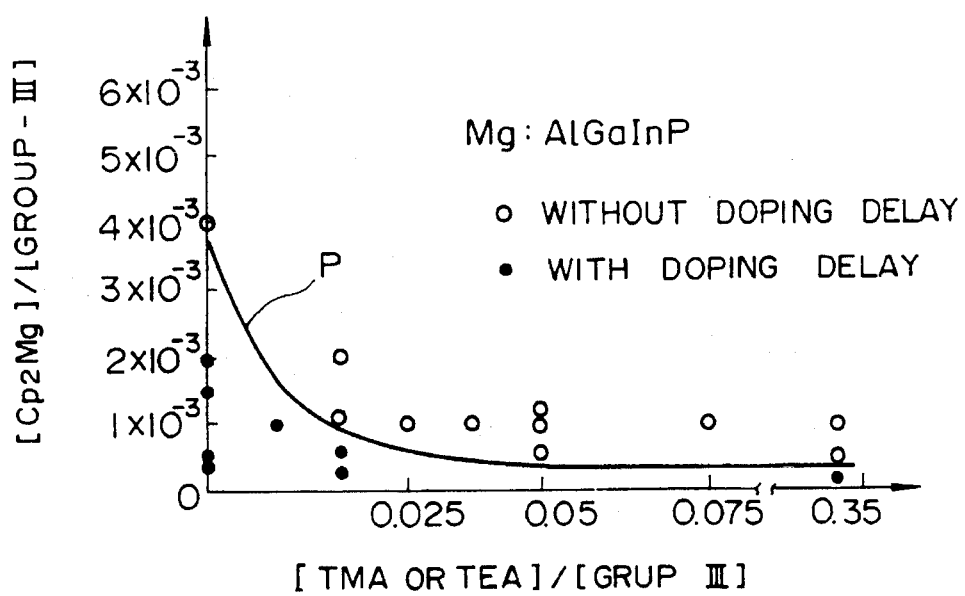

FIG. 9B shows the experimental results showing the Mg doping delay in the broader mixture range of Al than FIG. 9A. The abscissa represents the amount of Al element (TMA or TEA) relative to the total III group elements, and the ordinate represents the amount of Mg ($Cp_2Mg$) relative to the total group III elements. Data with a doping delay is represented by a solid circle, and data without a doping delay is represented by a circle. The area where any doping delay occurs is the area above the solid curve p. There is a tendency that the doping delay is suppressed as the amount of Mg to be doped or Al to be added increases. It is possible to judge that the suppression effect of Mg doping delay is generally uniform if the amount of Al to be added is about 0.1 or more of the total group III elements.

It is preferable to use a smaller amount of Al to be added in order not to change the characteristics of matrix material. It is preferable to set the amount of Al to be added to the Mg doping to 0.1 or less.

As described above, the doping delay can be shortened to the extent that no practical problem occurs, by mixing Al organo-metallic compound of a predetermined amount or more with Mg organo-metallic compound when Mg is used as p-type dopants.

Figure 10:
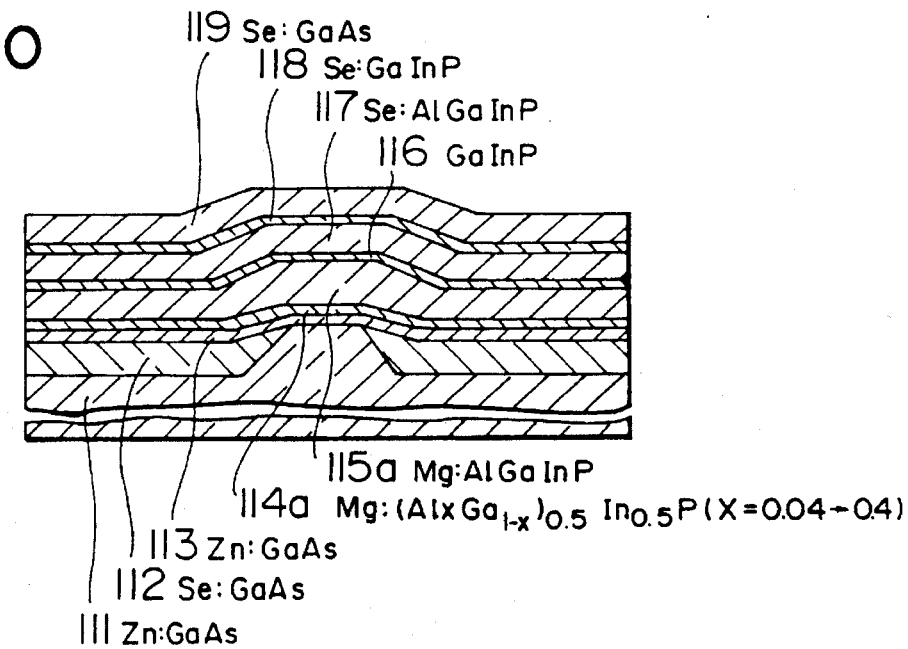
FIG. 10 is a cross sectional view of an SBW structure semiconductor laser according to an embodiment of the present invention.

FIG. 10 shows an SBW type visible light semiconductor laser according to an embodiment of the present invention.

A Zn doped p-type GaAs substrate 111 is formed on the surface thereof with a stripe-shaped mesa structure. A Se doped n-type GaAs current block layer 112 is formed on the GaAs substrate 111, embedding with it both the sides of the mesa structure to relax the mesa structure steps.

On this mesa structure, a Zn doped p-type GaAs buffer layer 113 is epitaxilally grown. This structure is the same as that shown in FIG. 5B. On the buffer layer 118, a Mg doped p-type $(Al_xGa_{1-x})_{0.5}In_{0.5}P$ intermediate layer 114a is epitaxially grown. The composition x of this layer is gradually changed from x=0.04 to x=0.4 from the side contacting the buffer layer, to provide a composition gradient layer. On the intermediate layer 114a, a Mg doped p-type AlGaInP clad layer 115a is epitaxially grown. The composition of the clad layer is $(Al_{0.7}Ga_{0.3})_{0.5}In_{0.5}P$.

Epitaxially grown on the clad layer 115a is a non-doped GaInP active layer 116 on which n-side laminated layers are epitaxially grown. The n-side laminated layers include a Se doped n-type AlGaInP clad layer 117, Se doped n-type GaInP intermediate layer 118, and Se doped n-type GaAs contact layer 119 sequentially laminated in this order on the active layer 116. The laminated layers on the active layer 116 have the same structure as that shown in FIG. 5B.

Figure 5B:
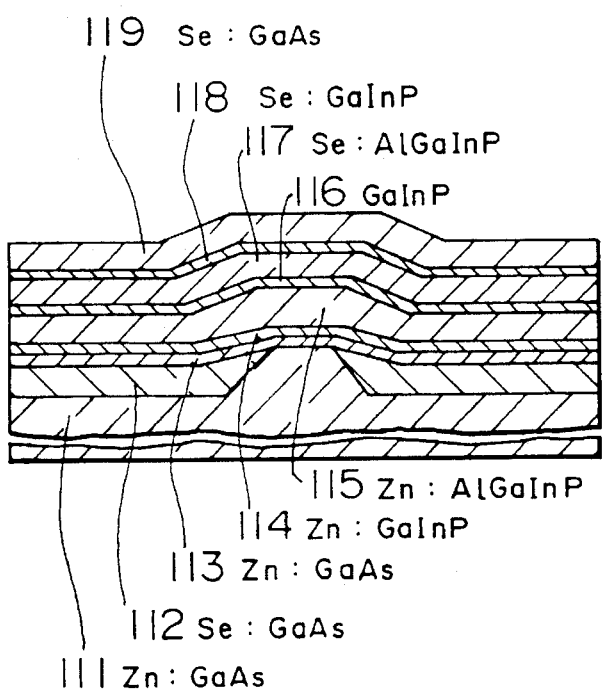
Figure 5C:
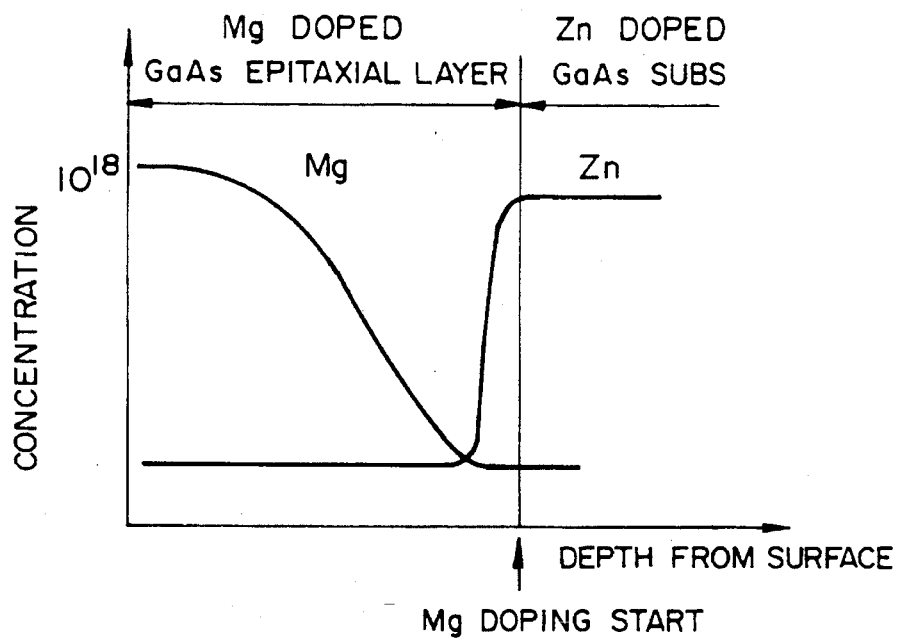
FIG. 5C is a graph showing the distribution of dopant concentrations.
Figure 5D:
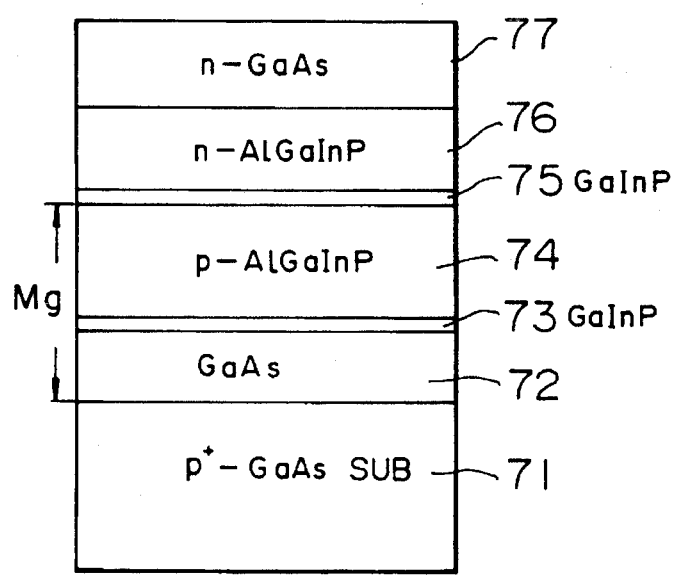
FIG. 5D is a cross sectional views showing an example of a visible light semiconductor laser.

This structure shown in FIG. 10 differs from that shown in FIG. 5B in that the intermediate layer 114a and clad layer 115a are doped with Mg, and the intermediate layer 114a is formed as a composition gradient layer.

For other information on such an SBW laser, refer U.S. patent application Ser. No. 892,680 which is a continuation application of U.S. Ser. No. 691,620 and corresponding to European Patent Application 91303783.4 (EP-A 454476), which is incorporated herein by reference.

With this structure, the intermediate layer contains Al so that this layer can be doped with Mg at a high concentration. Because the composition x of Al is set to 0.04 on the side contacting the buffer layer 113, the physical characteristics of the intermediate layer are substantially the same as GaInP. Although the intermediate layer contains Al, the characteristics are not substantially changed because of a small amount of Al.

A heterojunction bipolar transistor HBT uses an emitter made of material having a larger band gap than the base and collector. This transistor has drawn attention as fundamental elements of next generation ultra high speed integrated circuits because of its high gain, high drive capability, high speed, and the like. For the improvement of high speed operation characteristics of HBT, it is necessary to lower the base resistance by making the carrier concentration of the base region as high as possible, and to shorten the carrier transfer time by making the base film thickness as thin as possible. As doping material for the base of HBT, Zn, Be, C, Mg or the like may be used depending upon the crystal growth method (MBE, CBE, MOCVD, or other methods). Zn is used as dopants for various devices. However, when Zn is used for HBT, it is difficult to obtain a high carrier concentration necessary for HBT, and to form a thin base region because of a large diffusion in crystal. Although Be allows high concentration doping, it has also a diffusion in crystal, and still worse it is very toxicant. From these technical backgrounds, C and Mg have been much expected as alternative doping materials because they provide high concentration doping, less diffusion, and no toxicity.

A problem of the doping delay occurs when Mg is used for HBT. Most of group III–V compound semiconductor HBTs are AlGaAs/GaAs/GaAs, InP/InGaAs/InGaAs, and InAsAs/InGaAs/InGaAs (emitter/base/collector) based compound semiconductors. In any one of these compounds, the base is made of material not containing Al. The thickness of the base region is generally in the order of 100 angstroms, and so Mg is hardly doped in the base because of doping delay.

Figure 11:
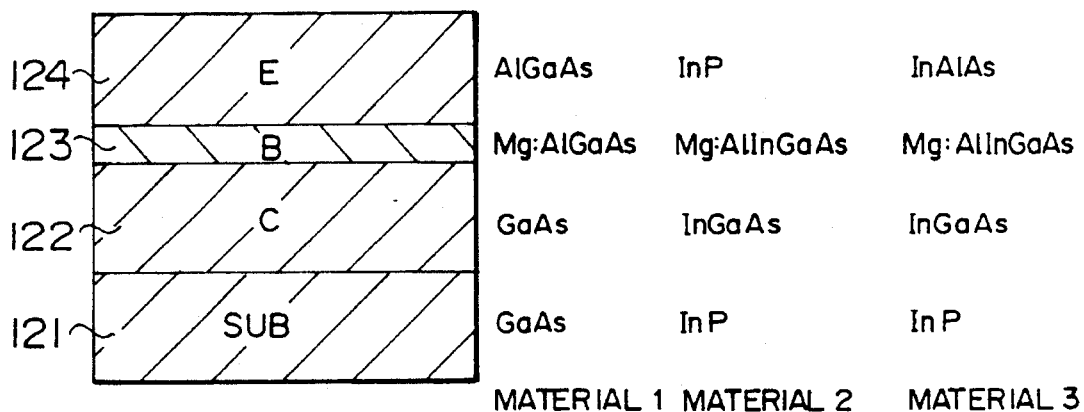
FIG. 11 is a cross sectional view of a hetrojunction bipolar transistor according to an embodiment of the present invention.

FIG. 11 shows the structure of a hetrojunction bipolar transistor according to an embodiment of the present invention. Laminated on a substrate 121 are an n-type collector region 122, p-type base region 123, and n-type emitter region 124.

In this transistor, GaAs, GaAs, Mg doped AlGaAs, and AlGaAs may be used for the substrate 121, collector region 122, base region 123, and emitter region 124, respectively. The amount of Mg to be doped in the base region 123 is determined in accordance with a desired carrier concentration, and the composition of Al to be mixed to Mg to avoid the doping delay is selected using, for example, the graph shown in FIG. 9B. The amount of Al to be mixed is 0.1 or less relative to the total III group elements.

Alternatively, InP, InGaAs, Mg doped AlInGaAs, and InP may be used for the substrate 121, collector region 122, base region 123, emitter region 124, respectively. In this case, the amount of Mg to be doped in the base region 123 is determined in accordance with a desired p-type impurity concentration, and the amount of Al to be mixed is selected within the range not substantially changing the physical characteristics of the base region and not generating Mg doping delay.

InP, InGaAs, Mg doped AlInGaAs, and InAlAs may also be used for the substrate 121, collector region 122, base region 123, and emitter region 124, respectively.

It is possible to eliminate the doping delay and provide a Sharp and high concentration in a thin base region, by adding a small amount of Al source material during the crystal growth of the base. Since the amount of Al entered in the base material is sufficiently small, the band gap difference between the emitter and base is sufficient to the extent that the operation of HBT is hindered. Furthermore, recombination defects causes by oxygen impuriries coupled with Al is not so much as to degrade the element characteristics.

When an optical fiber doped with erbium is excited by light having a specific wavelength, light having a different wavelength and propagating in the fiber can be amplified. Long-distance optical communications using such optical fiber amplification is now drawing attention. Although there are several wavelengths of light used for such excitation, it is known that light of 0.98 μm provides the most efficient amplification. From this technical background, semiconductor lasers oscillating at the wavelength 0.98 μm has been much expected.

Figure 12:
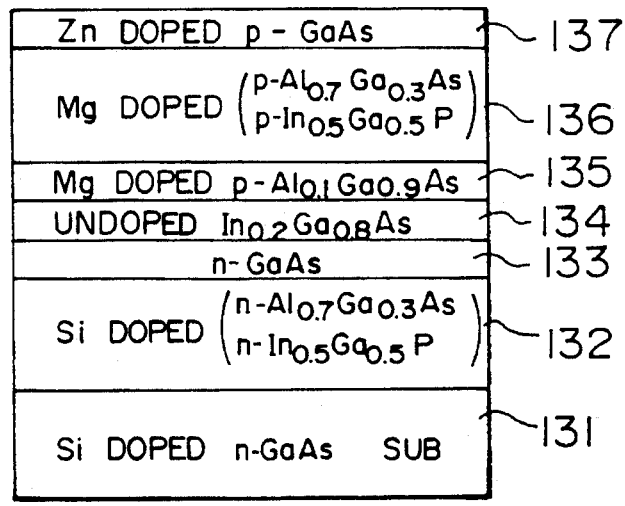
FIG. 12 is a cross sectional view of a visible light semiconductor laser with an emission wavelength near 1 μm according to an embodiment of the present invention.

FIG. 12 shows the structure in cross section of a typical semiconductor layer oscillating at the wavelength 0.98 μm. A semiconductor laser with a wavelength 0.98 μm cannot be manufactured theoretically by using mixed crystal material having a perfect lattice match with an InP or GaAs substrate. It is therefore necessary to use a peculiar combination in which an active layer is intentionally made to have a lattice. mismatch with other layers. In FIG. 12, reference numeral 131 represents a Si doped n-type GaAs substrate, reference numeral 132 represents a Si doped n-type AlGaAs clad layer, reference numeral 133 represents a Si doped n-type GaAs guide layer, reference numeral 134 represents a non-doped InGaAs strained quantum well active layer, reference numeral 135 represents a Mg doped p-type AlGaAs guide layer, reference numeral 136 represents a Mg doped p-type AlGaAs clad layer, and reference numeral 137 represents a Zn doped p-type GaAs contact layer. The composition and thickness of each layer take the following values by way of example:

clad layers 132, 136: $Al_{0.7}Ga_{0.3}As$ or $In_{0.5}Ga_{0.5}P$, 1 to 2 μm n-type guide layer 133: GaAs, 0.1 μm active layer 134: $In_{0.2}Ga_{0.8}As$, 50 to 100 A p-type guide layer 135: $Al_{0.1}Ga_{0.8}As$, 0.1 μm contact layer 137: GaAs, 0.5 to 1 μm The band gap of GaAs is 1.42 eV corresponding to the wavelength 0.87 μm. The wavelength can be made longer to about 1 μm by entering In into the GaAs active layer. In this case, the lattice constant becomes large as compared with GaAs. If the film thickness of InGaAs is a critical value or less, dislocations to be caused by lattice mismatch can be prevented. The composition to obtain the wavelength 0.98 is about $In_{0.2}GA_{0.8}As$ to $In_{0.3}Ga_{0.7}As$, and the critical film thickness is about 50 to 100 angstroms. This laser has excellent element characteristics (such as threshold current density and efficiency) because of the compressive strain effects provided to the active layer and the quantum well effects.

A sufficient light output is required to excite an optical fiber. One of the conditions of obtaining a high light output is to lower the resistance of a device element and suppress heat generation during the operation. To this end, it is necessary to increase the carrier concentration of an AlGaAs clad layer, particularly, p-type AlGaAs clad layer. Zn is generally used as p-type dopants for a p-type AlGaAs. However, Zn has a large diffusion in the crystal, posing a problem of a possibility of damaging the active layer. In contrast, Mg provides doping at a high concentration in the same degree as Zn, and has an advantage of a small diffusion in the crystal over Zn.

In using Mg as a p-type impurity, ideally Mg is doped to the GaAs guide layer. However, this Mg doping to the GaAs guide layer generates a large doping delay. In view of this, in growing the upper GaAs guide layer 185, a small amount of Al source material is added to eliminate the Mg doping delay, enabling to obtain a sharp doping profile From near the active layer. The carrier concentration of the guide layer 185 and clad layer 186 is $5*10^{17} cm^{-3}$ to $1*10^{18} cm^{-3}$, and the Al composition in the $Al_xGa_{1-x}As$ is about x=0.1. This Al composition will not disturb the light distribution.

Why the doping delay can be suppressed may be reasoned from the interaction between Mg organo-metallic compound and Al organo-metallic compound, and not from the composition of Al in the group III–V compound semiconductor. Accordingly, the above-described method is effective when using Mg as p-type dopants for not only AlGaInP based group III–V compound semiconductors but also other group III–V compound semiconductors.

The present invention has been described above in connection with the preferred embodiments. The invention is not limited only to those embodiments, but various modifications, improvements, combinations, and the like are apparent from those skilled in the art.

What is claimed is:

1. A group III–V compound semiconductor device comprising:

an underlie compound semiconductor crystal layer;

a first p-type group III–V compound semiconductor layer formed on said underlie compound crystal layer, said first p-type group III–V compound containing Mg as a p-type impurity and a group III element Al of a composition from about 0.02 to about 0.1; and a second p-type group III–V compound semiconductor layer formed on said first p-type group III–V compound semiconductor layer, said second p-type group III–V compound containing Mg as a p-type impurity and a III group element Al of a composition larger than the composition of said first p-type group III–V compound.

2. A group III–V compound semiconductor device according to claim 1, wherein said underlie compound semiconductor crystal layer includes a p-type group III–V compound semiconductor substrate having a mesa structure on the surface thereof, and an n-type burried layer embedded on both side surfaces of said mesa structure.

3. A group III–V compound semiconductor device according to claim 1, wherein said underlie compound semiconductor crystal layer has a GaAs surface doped with Zn as a p-type impurity, and said first p-type group III–V compound semiconductor layer is a p-type $(Al_xGa_{1-x})_{0.5}In_{0.5}As$ layer.

4. A group III–V compound semiconductor device according to claim 3, wherein said second p-type group III–V compound semiconductor layer is a p-type AlGaInP layer.

5. A group III–V compound semiconductor device according to claim 4, wherein said second p-type group III–V compound semiconductor layer is a p-type AlGaInP layer having a composition gradient gradually increasing an Al composition.

6. A group III–V compound semiconductor device according to claim 1, wherein said underlie compound semiconductor crystal layer is a non-doped InGaAs layer, and said first p-type group III–V compound semiconductor layer is a p-type AlGaAs layer.

7. A group III–V compound semiconductor device comprising:

an underlie compound semiconductor crystal layer;

a p-type group III–V compound semiconductor layer formed on said underlie compound crystal layer, said p-type group III–V compound containing Mg as a p-type impurity and a III group element Al of a composition from about 0.02 to about 0.1; and an n-type group III–V compound semiconductor layer formed on said p-type group III–V compound semiconductor.

8. A group III–V compound semiconductor device according to claim 7, wherein said underlie compound semiconductor crystal layer is a p-type InGaAs layer, and n-type III–V group compound semiconductor layer is one of an n-type AlGaAs layer, n-type InP layer, and n-type InAlAs yet.

* * * * *

UNITED STATES PATENT AND TRADEMARK OFFICE
CERTIFICATE OF CORRECTION

PATENT NO. : 5,458,085          Page 1 of 3
DATED : October 17, 1995
INVENTOR(S) : Makoto Kondo, et al.

It is certified that error appears in the above-indentified patent and that said Letters Patent is hereby corrected as shown below:

Title page, item [30]    "Mar. 4" should be --April 3--.
Item [56]
Other Publications line 2    "metalorganic" should be --Metalorganic--.

Column 2    line 2     change "118" to --113--;

line 4     change "118" to --113--;

line 21    change "118" to --113--.

Column 5,   line 8     after "illustrated", insert --in--;

line 10    after "formed", insert --Group--;

line 27    after "compound", insert --to--;

line 46    change "18" to --13--;

line 57    after "carrier", insert --gas--;

line 58    change "81" to --31--;

line 66    change "85" to --35--;

line 67    change "84" to --34--; change "86" to --36--.

Column 6    line 1     change "85" to --35--;

line 2     change "84" to --34--;

line 3     change "88" to --38--;

UNITED STATES PATENT AND TRADEMARK OFFICE
CERTIFICATE OF CORRECTION

PATENT NO. : 5,458,085
DATED : October 17, 1995
INVENTOR(S) : Makoto KONDO, et al.

It is certified that error appears in the above-indentified patent and that said Letters Patent is hereby corrected as shown below:

| | | |
|---|---|---|
| Column 6 | line 5, | change "84" to --34-- and "28" to --23--. |
| Column 7 | line 21, | before "was", insert --It--; |
| | line 54 | "68" (2nd occurrence) should be --63--. |
| Column 9 | line 14 | after "found", insert --that--; |
| | line 31 | change "98" to --93--; |
| | line 40 | "$cm^{-1}$" should be --$cm^{-3}$--; |
| | line 62 | after "mole" insert --flow--. |
| Column 10 | line 41 | change "118" to --113--. |
| Column 11 | line 67 | "Sharp" should be --sharp--. |
| Column 12 | line 25 | delete ".". |
| Column 13 | line 6 | change "185" to --135--. |
| | line 10 | change "185" to --135-- and "186" to --136--. |

UNITED STATES PATENT AND TRADEMARK OFFICE
CERTIFICATE OF CORRECTION

PATENT NO. : 5,458,085
DATED : October 17, 1995
INVENTOR(S) : Makoto Kondo, et al It is certified that error appears in the above-indentified patent and that said Letters Patent is hereby corrected as shown below:

Column 14, line 39, after "and", insert —said—.

Signed and Sealed this

Twenty-first Day of May, 1996

Attest:

BRUCE LEHMAN

Attesting Officer     Commissioner of Patents and Trademarks